(12) United States Patent
Janzen et al.

(10) Patent No.: US 7,280,410 B2
(45) Date of Patent: Oct. 9, 2007

(54) SYSTEM AND METHOD FOR MODE REGISTER CONTROL OF DATA BUS OPERATING MODE AND IMPEDANCE

(75) Inventors: Jeffrey W. Janzen, Meridian, ID (US); Christopher Morzano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/542,702

(22) Filed: Oct. 3, 2006

(65) Prior Publication Data

US 2007/0036006 A1 Feb. 15, 2007

Related U.S. Application Data

(62) Division of application No. 11/061,035, filed on Feb. 18, 2005, now Pat. No. 7,215,579.

(51) Int. Cl.
*G11C 7/10* (2006.01)

(52) U.S. Cl. .................... 365/189.01; 365/189.05; 365/189.08; 365/189.11

(58) Field of Classification Search .......... 365/189.01, 365/189.03, 189.05, 189.08, 189.09, 189.11, 365/189.12, 233
See application file for complete search history.

(56) References Cited

U.S. PATENT DOCUMENTS

| | | | |
|---|---|---|---|
| 5,097,149 A | 3/1992 | Lee | 307/443 |
| 5,099,148 A | 3/1992 | McClure et al. | 307/443 |
| 5,128,560 A | 7/1992 | Chern et al. | 307/475 |
| 5,134,311 A | 7/1992 | Biber et al. | 307/270 |
| 5,274,276 A | 12/1993 | Casper et al. | 307/443 |
| 5,576,656 A | 11/1996 | McClure | 327/538 |
| 5,594,373 A | 1/1997 | McClure | 327/108 |
| 5,606,275 A | 2/1997 | Farhang et al. | 327/108 |
| 5,617,064 A | 4/1997 | Gorecki | 333/22 R |
| 5,729,152 A | 3/1998 | Leung et al. | 326/21 |
| 5,732,027 A | 3/1998 | Arcoleo et al. | 365/189.05 |
| 5,754,480 A | 5/1998 | Sato | 365/189.05 |
| 5,834,951 A | 11/1998 | Klein | 327/53 |
| 5,864,506 A | 1/1999 | Arcoleo et al. | 365/189.05 |
| 5,903,504 A | 5/1999 | Chevallier et al. | 365/207 |
| 5,926,031 A | 7/1999 | Wallace et al. | 326/30 |
| 5,949,254 A | 9/1999 | Keeth | 326/87 |
| 5,995,443 A | 11/1999 | Farmwald et al. | 365/233 |

(Continued)

*Primary Examiner*—Anh Phung
*Assistant Examiner*—Toan Le
(74) *Attorney, Agent, or Firm*—Dorsey & Whitney LLP (57) ABSTRACT

A DRAM device includes a mode register that is programmed to select one of two modes for operating data bus terminals in the device. A timing circuit generates timing signals in synchronism with the clock signal that correspond to the selected mode. The timing signals are combined with read data signals to generate corresponding timed read data signals. These timed data signals and termination signals from the timing circuit are applied to pull-up and pull-down circuitry, which drive respective pull-up and pull-down transistors coupled to the data bus terminals. The transistors drive the data bus terminals to either a first or a second voltage if the first mode of operation is selected and to either a third or a fourth voltage if the second mode of operation is selected. Additionally, the pull-up and pull-down transistors bias the data bus terminals to respective voltages corresponding to the selected operating mode.

25 Claims, 8 Drawing Sheets

U.S. PATENT DOCUMENTS

| | | | |
|---|---|---|---|
| 6,026,456 A | 2/2000 | Ilkbahar | 710/101 |
| 6,060,907 A | 5/2000 | Vishwanthaiah et al. | 326/87 |
| 6,066,977 A | 5/2000 | Felton et al. | 327/390 |
| 6,069,504 A | 5/2000 | Keeth | 327/108 |
| 6,087,853 A | 7/2000 | Huber et al. | 326/83 |
| 6,198,307 B1 | 3/2001 | Garlepp et al. | 326/83 |
| 6,222,388 B1 | 4/2001 | Bridgewater | 326/86 |
| 6,236,255 B1 | 5/2001 | Oguri | 327/310 |
| 6,288,563 B1 | 9/2001 | Muljono et al. | 326/27 |
| 6,307,424 B1 | 10/2001 | Lee | 327/530 |
| 6,307,791 B1 | 10/2001 | Otsuka et al. | 365/189.05 |
| 6,323,687 B1 | 11/2001 | Yano | 326/83 |
| 6,330,194 B1 | 12/2001 | Thomann et al. | 365/189.05 |
| 6,339,351 B1 | 1/2002 | Ang et al. | 327/170 |
| 6,351,138 B1 | 2/2002 | Wong | 326/30 |
| 6,351,421 B1 | 2/2002 | Merritt | 365/189.11 |
| 6,359,465 B1 | 3/2002 | Hui | 326/30 |
| 6,373,276 B1 | 4/2002 | Hui | 326/30 |
| 6,388,495 B1 | 5/2002 | Roy et al. | 327/309 |
| 6,420,913 B1 | 7/2002 | Ang et al. | 327/108 |
| 6,424,169 B1 | 7/2002 | Partow et al. | 326/30 |
| 6,445,245 B1 | 9/2002 | Schultz et al. | 327/541 |
| 6,445,316 B1 | 9/2002 | Hsu et al. | 341/120 |
| 6,456,124 B1 | 9/2002 | Lee et al. | 327/108 |
| 6,459,320 B2 | 10/2002 | Lee | 327/310 |
| 6,466,487 B1 | 10/2002 | Otsuka | 365/189.05 |
| 6,480,798 B2 | 11/2002 | Lee | 702/107 |
| 6,496,037 B1 | 12/2002 | Bertin et al. | 326/82 |
| 6,501,306 B1 | 12/2002 | Kim et al. | 327/112 |
| 6,545,522 B2 | 4/2003 | Mughal et al. | 327/334 |
| 6,549,036 B1 | 4/2003 | Lee | 326/83 |
| 6,552,959 B2 * | 4/2003 | Yamauchi et al. | 365/233 |
| 6,563,337 B2 | 5/2003 | Dour | 326/30 |
| 6,643,789 B2 | 11/2003 | Mullarkey | 713/401 |
| 6,657,906 B2 | 12/2003 | Martin | 365/198 |
| 6,700,418 B2 | 3/2004 | Yu et al. | 327/108 |
| 6,711,073 B2 | 3/2004 | Martin | 365/198 |
| 6,885,226 B2 | 4/2005 | Waldrop | 327/112 |
| 6,944,071 B2 | 9/2005 | Martin | 365/198 |
| 6,965,529 B2 * | 11/2005 | Zumkehr et al. | 365/189.05 |
| 7,019,553 B2 | 3/2006 | Blodgett et al. | 326/30 |
| 7,106,638 B2 | 9/2006 | Martin | 365/198 |
| 2004/0017696 A1 | 1/2004 | Allen et al. | 365/189.05 |
| 2004/0141380 A1 | 7/2004 | Kim et al. | 365/189.05 |
| 2005/0094468 A1 | 5/2005 | Martin | 365/222 |

* cited by examiner

SYSTEM AND METHOD FOR MODE REGISTER CONTROL OF DATA BUS OPERATING MODE AND IMPEDANCE

CROSS-REFERENCE TO RELATED APPLICATION

This application is a divisional of U.S. patent application Ser. No. 11/061,035, filed Feb. 18, 2005 now U.S. Pat. No. 7,215,579.

TECHNICAL FIELD

The present invention relates generally to memory devices, and more specifically to a system and method for allowing user selection of the operating mode and input and output impedance of data bus terminals.

BACKGROUND OF THE INVENTION

In synchronous memory devices, such as synchronous dynamic random access memory ("SDRAM") devices, the memory device is clocked by an external clock signal to allow operations to be performed at predetermined times relative to the rising and falling edges of the applied clock signal. For example, write data signals are applied to data bus terminals of the memory device in synchronism with the external clock signal, and the memory device must latch these data signals at the proper times to successfully capture the data signals. In the present description, "external" is used to refer to signals and operations outside of the memory device, and "internal" to refer to signals and operations within the memory device.

In a conventional SDRAM device, data drivers in the memory device may operate in either of two modes. In the first mode, known as the center tapped termination ("CTT") mode, the memory devices biases the data bus terminals to a voltage intermediate high and low voltages corresponding to logic levels between which the terminals are switched to output read data signals. These high and low voltages are typically a supply voltage $V_{CC}$ and ground, respectively, and the CTT termination voltage is $V_{CC}/2$. When read data signals are output from the memory device, the memory device drives the data bus terminals from $V_{CC}/2$ to either $V_{CC}$ or ground depending on whether the corresponding read data bits are "1" or "0," respectively. When write data signals are to be applied to the data bus terminals, the data bus terminals are biased to $V_{CC}/2$. The externally applied write data signals applied to the data bus terminals drive the data bus terminals from $V_{CC}/2$ to either $V_{CC}$ or ground depending on whether the corresponding write data bits are "1" or "0," respectively. One set of read data signals are generally output from the memory device and one set of write data signals are generally applied to the memory device in synchronism with the rising edge of the clock signal. However, in double-data rate ("DDR") memory devices, one set of read data signals are output from the memory device and one set of write data signals are applied to the memory device in synchronism with both the rising edge and the falling edge of the clock signal. When the memory device is inactive, the memory device does not bias the data bus terminals, but they are left at a high impedance and biased to $V_{CC}/2$ by external circuitry.

In the other mode, known as the default high ("VDD") mode, the data bus terminals are biased to $V_{CC}$ when data are to be either written to or read from the memory device. More specifically, the data bus terminals are biased to $V_{CC}$ during a preamble occurring before data are to be read from or written to the memory device, and during a postamble occurring after data have been read from or written to the memory device. The duration of the preamble is typically one-clock period, and the duration of the postamble is typically one-half clock period. When read data signals are output from the memory device, the data bus terminals are driven from $V_{CC}$ to ground if the corresponding read data bits are "0." If the corresponding read data bits are "1," the voltage at the data bus terminals remains at $V_{CC}$. Write data signals applied to the data bus terminals drive the data bus terminals to ground if the corresponding write data bits are "0," but maintain the data bus terminals at $V_{CC}$ if the corresponding write data bits are "1." Again, when the memory device is inactive, the memory device does not bias the data bus terminals, but they are left at a high impedance and biased to $V_{CC}$ by external circuitry.

Another variation in the operating characteristics of memory device data bus terminals is the input and output impedance of the terminals. The input impedance of the data bus terminals affects the amount of current required to drive the data bus terminals to voltages corresponding to the two logic levels as well as the switching characteristics of the data bus terminals. Generally, a lower input impedance requires more current to drive the data bus terminals high and low, but it allows the terminals to be switched at a faster rate. The output impedance of the data bus terminals affects the "drive strength" of the memory device, i.e., the ability of the memory device to drive components connected to the data bus terminals. Again, a lower output impedance can require more current, but it can allow the data bus terminals to be switched at a faster rate.

In the past, the operating mode and input and output impedance of memory device data terminals were determined at the time memory devices were manufactured, although in some cases, the operating mode and/or impedance could be selected by opening or closing programmable links during manufacture. More recently, memory devices have been manufactured with an extended load mode register that includes an output drive strength bit. The drive strength bit can be programmed so that read data drivers operate in either a low impedance, full-drive mode or a high impedance, reduced-drive mode of operation. A memory controller typically sets the output drive strength bit in the extended load mode register via a load mode register command to thereby place the data driver in the desired operating mode. The data driver is typically placed in the full-drive mode when the DDR SDRAM device is being utilized in a conventional application, such as on a conventional memory module. The data driver may be placed in the reduced-drive mode when the DDR SDRAM device is being utilized in a point-to-point application, such as on a graphics card. During the full-drive mode, the data driver provides sufficient current to drive the DQ signals to full-range voltages for a particular loading of the data bus, while during the reduced-drive mode the driver provides a reduced current to drive the DQ signals to reduced voltages given the same loading of the data bus.

Although conventional memory devices, such as DDR SDRAM devices, allow limited user programmability of the output impedance of data bus terminals, they do not allow user programmability of the operating mode of the data bus terminals, including the establishment of preamble and postamble conditions in the VDD mode, nor do they allow adjustment of the input or termination impedance when write data signals are being coupled to either the memory device or to another memory device that is connected to a common bus.

There is therefore a need for a system and method to allow a user more complete programmability of the operating mode and impedance of memory device data bus terminals.

SUMMARY OF THE INVENTION

A memory device having a plurality of data bus terminals is programmed to control the operation of a memory device in either a first mode or a second mode. The data bus terminals are biased to a first voltage when write data signals are to be applied to the data bus terminals in the first operating mode. The data bus terminals are biased to a second voltage when write data signals are to be applied to the data bus terminals in the second operating mode. When the memory device is to output read data signals, the data bus terminals are driven to either a third voltage or a fourth voltage in the first operating mode. In the second operating mode, the data bus terminals are driven to either a fifth voltage or a sixth voltage when read data signals are to be applied to the data bus terminals.

DETAILED DESCRIPTION

Figure 1:
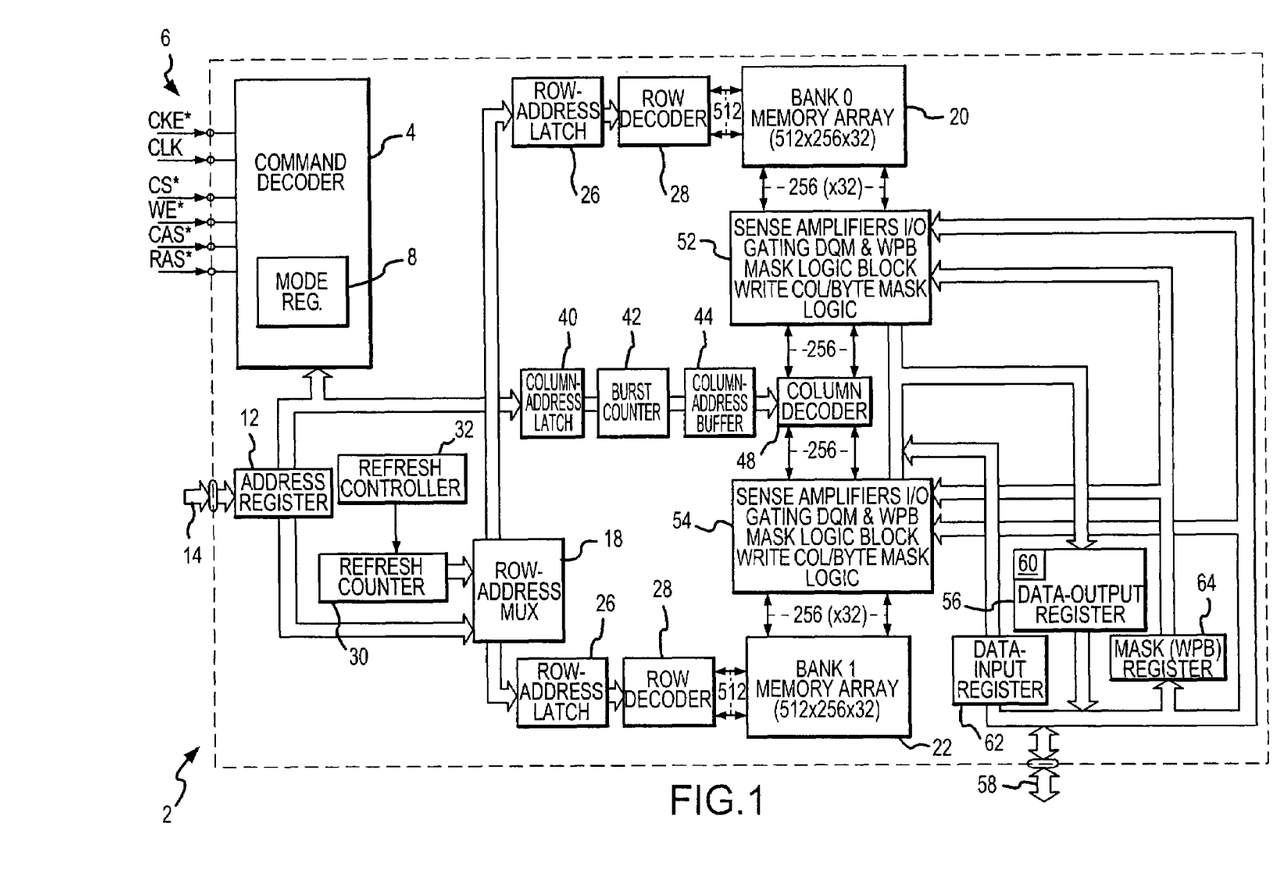
FIG. 1 is a functional block diagram of a memory device according to one embodiment of the invention.

FIG. 1 is a functional block diagram of a memory device including a data bus terminal mode and impedance control system according to one embodiment of the invention. The memory device is a double-data rate (DDR) synchronous dynamic random access memory ("SDRAM") 2, although the principles described herein are particularly applicable to DDR II DRAM or any other memory device. The SDRAM 2 includes a command decoder 4 that controls the operation of the SDRAM 2 responsive to high-level command signals received on a control bus 6. These high level command signals, which are typically generated by a memory controller (not shown in FIG. 1), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 4 generates a sequence of command signals responsive to the high level command signals to carry out the function (e.g., a read or a write) designated by each of the high level command signals. The command decoder 4 also includes a mode register 8 that can be programmed by conventional means to select various operating modes in the SDRAM 2. According to one embodiment of the invention, the mode register 8 can be programmed to select the operating mode and impedance of data bus terminals, which will be described in greater detail below.

The SDRAM 2 includes an address register 12 that receives row addresses and column addresses through an address bus 14. A row address is generally first received by the address register 12 and applied to a row address multiplexer 18. The row address multiplexer 18 couples the row address to a number of components associated with either of two memory banks 20, 22 depending upon the state of a bank address bit forming part of the row address. Associated with each of the memory banks 20, 22 is a respective row address latch 26, which stores the row address, and a row decoder 28, which decodes the row address and applies corresponding signals to one of the arrays 20 or 22. The row address multiplexer 18 also couples row addresses to the row address latches 26 for the purpose of refreshing the memory cells in the arrays 20, 22. The row addresses are generated for refresh purposes by a refresh counter 30, which is controlled by a refresh controller 32. The refresh controller 32 is, in turn, controlled by the command decoder 4.

After the row address has been applied to the address register 12 and stored in one of the row address latches 26, a column address is applied to the address register 12. The address register 12 couples the column address to a column address latch 40. Depending on the operating mode of the SDRAM 2, the column address is either coupled through a burst counter 42 to a column address buffer 44, or to the burst counter 42 which applies a sequence of column addresses to the column address buffer 44 starting at the column address output by the address register 12. In either case, the column address buffer 144 applies a column address to a column decoder 48.

Data to be read from one of the arrays 20, 22 is coupled to column circuitry 52, 54 for one of the arrays 20, 22, respectively. The data is then coupled through a data output register 56 to data bus terminals 58. According to one embodiment of the invention, the data output register 56 includes a data bus terminal mode and impedance control system 60 that controls the operating mode and impedance of the data bus terminals 58. More specifically, the mode register 8 in the command decoder 4 is programmed to operate the data output register 58 in either the CTT mode or a VDD mode described above. In both the CTT mode and the VDD mode, pull-up transistors (not shown in FIG. 1) are turned ON to couple the data bus terminals to a supply voltage to output high read data signals, and pull-down transistors (not shown in FIG. 1) are turned ON to couple the data bus terminals 58 to a ground to output low read data signals. However, the number of pull-up and pull-down transistors that are turned ON may vary between the two modes. The data bus terminal mode and impedance control system 60 also selectively turns ON and OFF the pull-up and pull-down transistors in the data output register 56 when read data signals are not being output from the SDRAM device 2. More specifically, in the VDD mode, a selected number of pull-up transistors are turned ON to bias the data bus terminals 58 to a supply voltage when write data signals are to be applied to the data bus terminals 58. The selected number of pull-up transistors are preferably turned ON during a predetermined preamble time, such as one clock period before, and a predetermined postample time, such as one-half clock period after, write data signals are to be applied to the data bus terminals 58. In the CTT mode, a selected number of pull-up transistors and a selected number of pull-down transistors are turned ON to bias the data bus terminals 58 to one-half the supply voltage. The write data signals are coupled from the data bus terminals 58 to a data input register 62, and from the data input register 62 to one of the arrays 20, 22 through the column circuitry 52, 54, respectively. A mask register 64 responds to a data mask DM signal to selectively alter the flow of data into and out of the column circuitry 52, 54, such as by selectively masking data to be read from the arrays 20, 22. When neither read data signals are being output from the SDRAM 2 nor write data signals are being input to the SDRAM 2, the data bus terminal mode and impedance control system 60 turns OFF the pull-up and pull-down transistors in the data output register 56.

Figure 2:
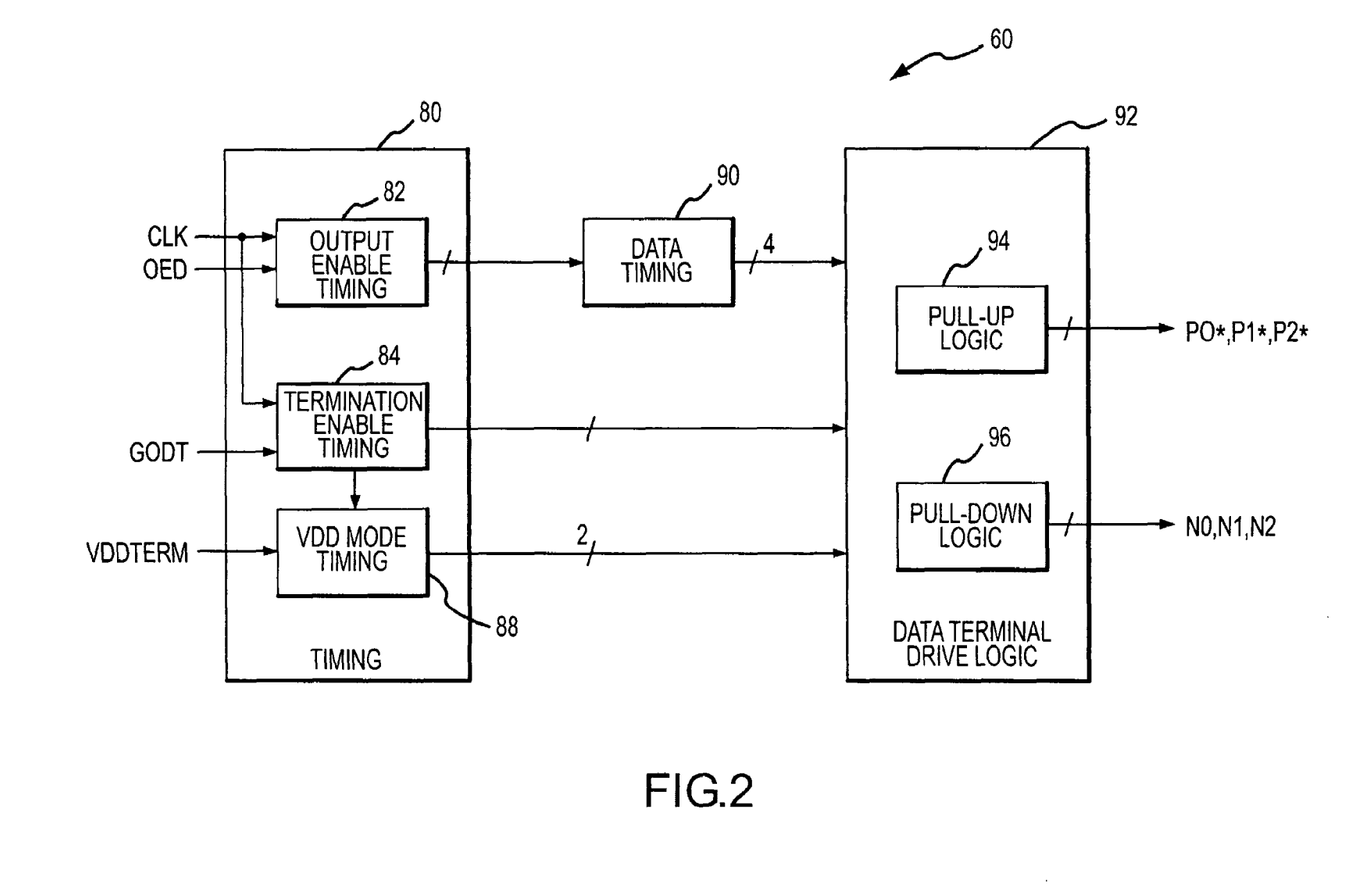
FIG. 2 is a functional block diagram of a data bus terminal mode and impedance control system according to one embodiment of the invention, which may be used in the memory device of FIG. 1.

FIG. 2 is a functional block diagram of a data bus terminal mode and impedance control system 60 according to one embodiment of the invention. The system 60 includes a timing circuit 80 that outputs a first set of timing signals responsive to various transitions of a clock CLK signal when an OED signal transitions high. The timing circuit 80 also outputs a second set of timing signals responsive to various transitions of the CLK signal when a GODT signal transitions high. As explained in greater detail below, the first set of timing signals is generated by an output enable timing circuit 82 to control the timing at which the data bus terminals 58 output read data responsive to the OED signal transitioning high. The second set of timing signals are generated by a termination enable timing circuit 84 to control the timing at which the data bus terminals 58 are terminated with a selected bias voltage and impedance when write data are to be input responsive to a GODT signal transitioning high.

The timing circuit 80 also includes a VDD mode timing circuit 88 that generates a set of timing signals in the VDD mode but not in the CTT mode responsive to a VDDTERM signal, which is active high in the VDD mode, and various signals generated by the termination enable timing circuit 84. The manner in which the VDD mode timing circuit 88 generates the timing signals will be explained in greater detail below.

The OED signal, the GODT signal and the VDDTERM signal are generated by the command decoder 4 (FIG. 1) based on mode bits programmed into the mode register 8 in the command decoder 4.

The first set of timing signals produced by the output enable timing circuit 82 are combined with read data signals in a data timing circuit 90. Basically, the data timing circuit 90 outputs four control signals, namely:

a first signal indicating that data that is valid responsive to the rising edge of a clock signal has a high logic level;

a second signal indicating that data that is valid responsive to the rising edge of a clock signal has a low logic level;

a third signal indicating that data that is valid responsive to the falling edge of a clock signal has a high logic level; and a fourth second signal indicating that data that is valid responsive to the falling edge of a clock signal has a low logic level.

The data bus terminal mode and impedance control system 60 further includes data terminal drive logic 92 that receives the four control signals from the data timing circuit 90 as well as the second set of signals from the termination enable timing circuit 84 and the clock signals from the clock timing circuit 88. The data terminal drive logic 92 includes pull-up logic 94, which is active to drive or bias the data bus terminals 58 high, and pull-down logic 96, which is active to drive or bias the data bus terminals 58 low. The pull-up logic 94 generates active low pull-up signals P0*, P1*, P2* that turn ON respective pull-up transistors (not shown in FIG. 2). The pull-down logic 96 generates active high pull-down signals N0, N1, N2 that turn ON respective pull-down transistors (not shown in FIG. 2).

Figure 3:
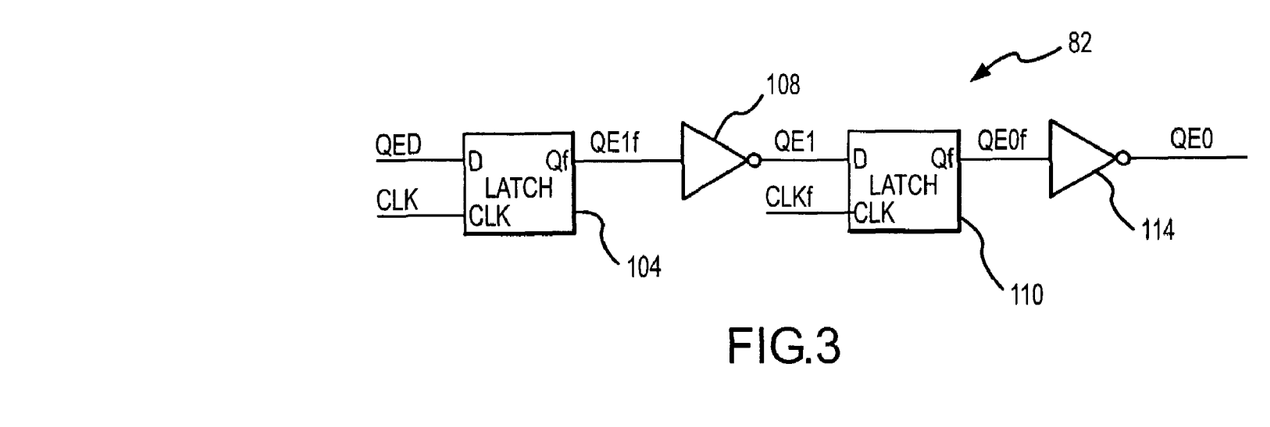
FIG. 3 is a logic diagram showing one embodiment of an output enable timing circuit that may be used in the data bus terminal mode and impedance control system of FIG. 2.

One embodiment of the output enable timing circuit 82 in the timing circuit 80 is shown in FIG. 3. As previously mentioned, the output enable timing circuit 82 controls the timing at which the data bus terminals 58 output read data signals. The output enable timing circuit 82 contains a latch 104 having a data input terminal "D" to which an output data enable "OED" signal is applied and a clock input terminal to which the clock "CLK" signal is applied. When the SDRAM device 2 is enabled to output read data signals, the OED signal transitions high, and a QE1f signal (as used herein the suffix "f" designates the signal as the compliment of a signal not having the suffix) transitions low on the next rising edge of the CLK signal, since the output of the latch is taken at the complimentary Qf output terminal. A QE1 signal at the output of an inverter 108 therefore transitions high on the rising edge of the CLK signal following the OED signal transitioning high.

The QE2 signal at the output of the inverter 108 is applied to a second latch 110, which has a clock terminal receiving the compliment of the clock signal, CLKf. The Qf output of the latch 110 therefore transitions low on the falling edge of the CLK signal, which causes a QE0 signal at the output of an inverter 114 to transition high.

In operation, when the QED signal transitions high, the QE1 signal transitions high on the next rising edge of the CLK signal, and the QE0 signal then transitions high on the subsequent falling edge of the CLK signal.

Figure 4:
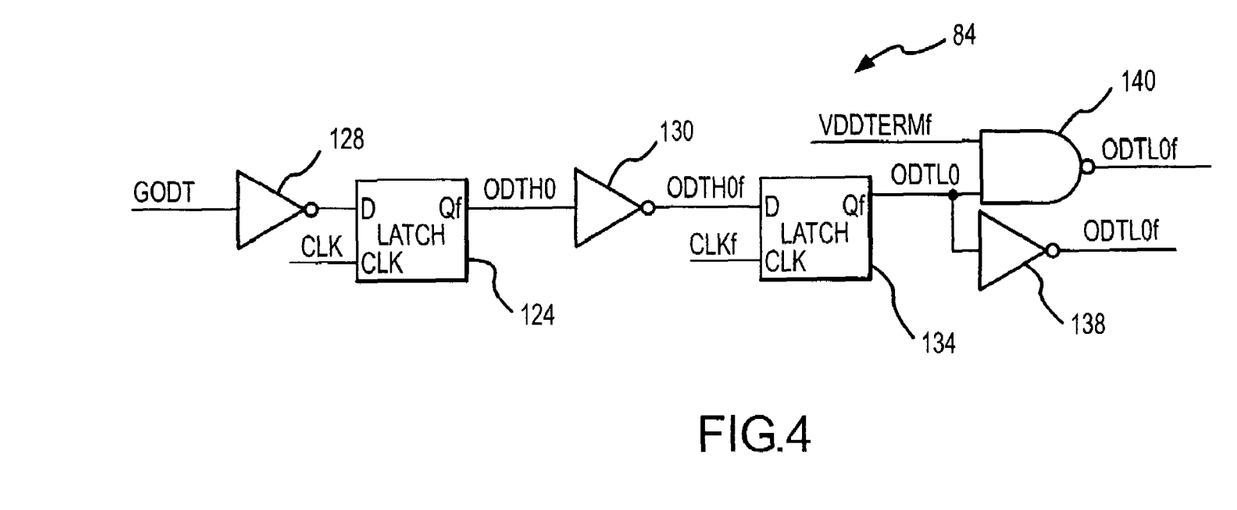
FIG. 4 is a logic diagram showing one embodiment of a termination enable timing circuit that may be used in the data bus terminal mode and impedance control system of FIG. 2.

One embodiment of the termination enable timing circuit 84 in the timing circuit 80 is shown in FIG. 4. As previously mentioned, the termination enable timing circuit 84 controls the timing of the bias level and impedance at the data bus terminals 58 when the SDRAM 2 is active but the data bus terminals 58 are not outputting read data. The termination enable timing circuit 84 includes a first latch 124 having a data terminal to which a termination enable "GODT" signal is applied through an inverter 128. When the GODT signal transitions high, the low at the output of the inverter 128 is clocked into the latch 124 on the next rising edge of the CLK signal, to output a high ODTH0 signal at the Qf output of the latch 124. The complimentary ODTH0f signal is obtained at the output of an inverter 130 and applied to the data input of a second latch 134, which is clocked by the CLKf signal on the falling edge of the CLK signal. The latch 134 then outputs a high ODTL0 signal from its Qf output terminal. Therefore, in operation, when the GODT signal transitions high, the ODTH0 signal transitions high on the next rising edge of the CLK signal. The ODTL0 signal at the output of the latch 134 is applied to the input of an inverter 138, which outputs an ODTL0f signal. As explained in greater detail below, a low ODTL0f signal causes the data bus terminals 58 to be coupled to ground when read data signals are not being applied to the data bus terminals 58.

The ODTL0 signal is also applied to one input of a NAND gate 140. The other input of a NAND gate 140 receives a VDDTERMf signal, which is low whenever the mode register 8 (FIG. 1) has been programmed so that the memory device operates in the VDD mode. In operation in the CTT mode, the ODTL0f signal transitions low responsive to the GODT signal transitioning high following the rising edge and subsequent falling edge of the clock signal. In the VDD mode, the ODTL0f signal remains high and never transitions low.

Figure 5:
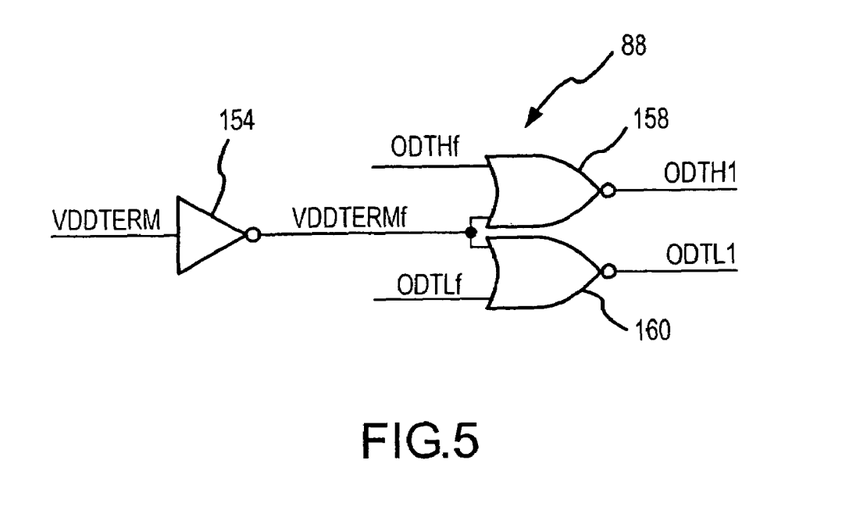
FIG. 5 is a logic diagram showing one embodiment of a clock timing circuit that may be used in the data bus terminal mode and impedance control system of FIG. 2.

FIG. 5 shows one embodiment of the clock timing circuit 88 in the timing circuit 80, which generates a clock signal in the VDD mode but not in the CTT mode. The clock timing circuit 88 includes an inverter 154 that receives a VDDTERM signal, which is active high whenever the mode register has been programmed to operate in the VDD mode. The inverter 154 generates a VDDTERMf signal, which is applied to an input of each of two NOR gates 158, 160. The NOR gates 158, 160 are disabled in the CTT mode when VDDTERM is low to produce low ODTH1 and ODTL1 signals, respectively. In the VDD mode when VDDTERM is high, the ODTH1 signal at the output of the NOR gate 158 transitions high on the rising edge of the CLK signal following the GODT signal transitioning high, and the ODTL1 signal at the output of the NOR gate 160 transitions high on the subsequent falling edge of the CLK signal.

Figure 6:
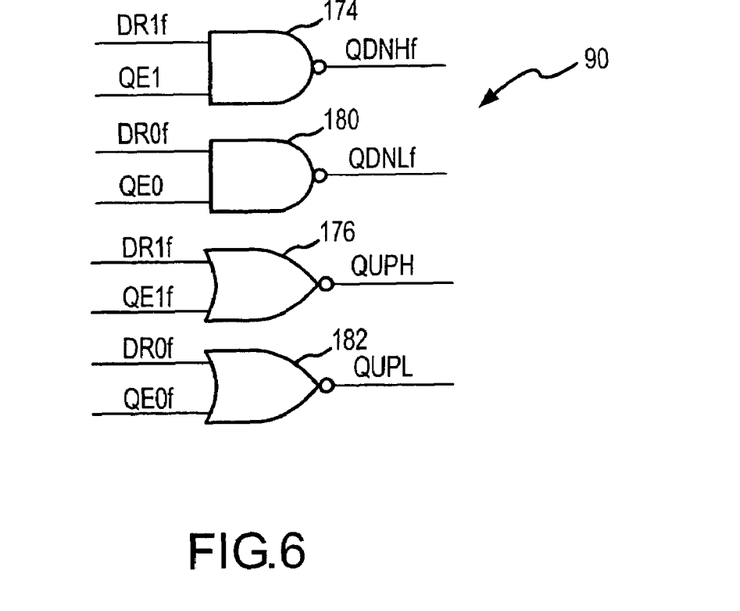
FIG. 6 is a logic diagram showing one embodiment of a data timing circuit that may be used in the data bus terminal mode and impedance control system of FIG. 2.

The signals produced by the output enable timing circuit 82 are combined with read data signals in the data timing circuit 90, an embodiment of which is shown in FIG. 6. The data timing circuit 90 includes a NAND gate 174 and a NOR gate 176 that each receive a DR1f signal, which has a logic level that is the compliment of a data bit that is valid on the rising edge of the CLK signal. The other input of the NAND gate 174 receives the QE1 signal, which transitions active high to enable the NAND gate 174 on the rising edge of the CLK signal. The other input of the NOR gate 176 receives the QE1f signal, which transitions low to enable the NOR gate 176 on the rising edge of the CLK signal. Thus, the NAND gate 174 and the NOR gate 176 are disabled to output a high QDNHf signal and a low QUPH signal, respectively. The NAND gate 174 and the NOR gate 176 are enabled to generate QDNHf and QUPH signals, respectively, that are the compliment of the DR1f signal responsive to the rising edge of the CLK signal. Thus, when the NAND gate 174 and the NOR gate 176 are enabled, the QDNHf and QUPH signals have logic levels corresponding to the logic level of the rising edge clock data signal.

In a similar manner, a NAND gate 180 and a NOR gate 182 each receive a DR0f signal, which has a logic level that is the compliment of a data bit that is valid on the falling edge of the CLK signal. The NAND gate 180 and the NOR gate 182 receive the QE0 and QE0f signal, respectively, so they are enabled on the falling edge of the CLK signal following the QED becoming active. As a result, they output QDNLf and QUPL signals, respectively, that are the compliment of the clock falling edge complimentary data signal DR0f. Thus, when the NAND gate 180 and the NOR gate 182 are enabled, the QDNLf and QUPL signals have logic levels corresponding to the logic level of the falling edge clock data signal. When the NAND gate 180 and the NOR gate 182 are disabled, they output a high QDNLf and a low QUPL signal, respectively.

Figure 7:
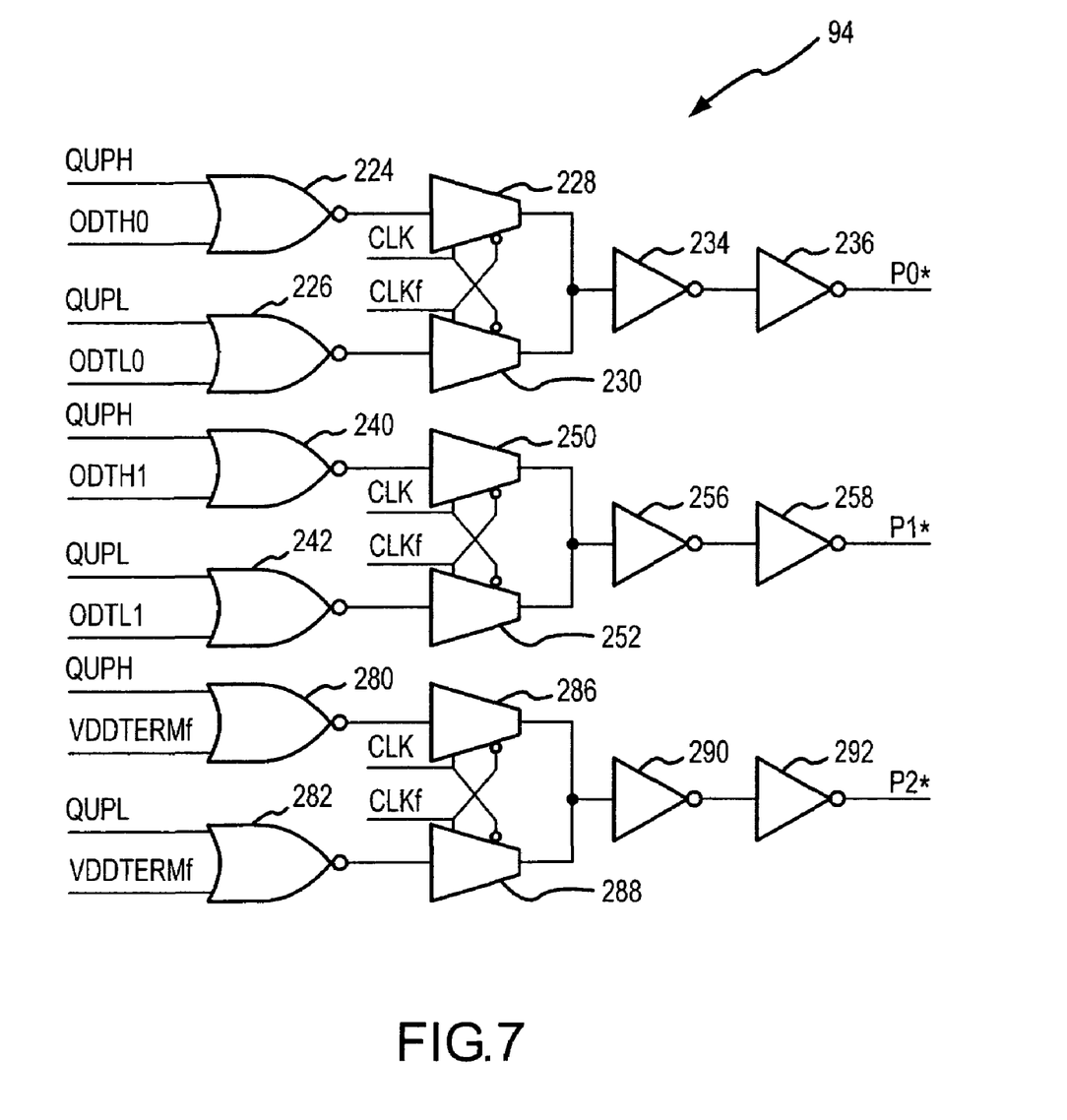
FIG. 7 is a logic diagram showing one embodiment of pull-up logic that may be used in data terminal drive logic, which is part of the data bus terminal mode and impedance control system of FIG. 2.

One embodiment of the pull-up logic 94 used in the data terminal drive logic 92 of FIG. 2 is shown in FIG. 7. As previously mentioned, the pull-up logic 94 generates signals that selectively drive or bias the data bus terminals 58 high. The pull-up logic 94 includes a first set of NOR gate 224, 226 having outputs that are coupled to cross-coupled pass gates 228, 230, which are alternately enabled by complimentary CLK and CLK* signals. The outputs of the pass gates 228, 230 are coupled through a pair of inverters 234, 236 to generate the P0* signal. As explained in greater detail below, when the P0* signal is active low, it turns ON a PMOS transistor to couple the data bus terminal to $V_{CC}$.

The NOR gate 224 receives the QUPH signal, which corresponds to the clock rising edge data signal on the rising edge of the CLK signal following the OED signal transitioning high. Thus, the QUPH signal corresponds to a read data bit that is valid on the rising edge of the CLK signals. When the QUPH signal is not active, it remains low to enable the NOR gate 224. The NOR gate 224 also receives the ODTH0 signal, which is generated by the latch 124. As previously explained, the ODTH0 signal transitions high on the rising edge of the CLK signal following the termination signal GODT transitioning high. Otherwise the ODTH0 signal is low to enable the NOR gate 124. As also previously explained, the OED signal transitions high when read data signals are to be output from the data bus terminals, and the GODT signal transitions high when write data signals are to be input through the data bus terminals. Insofar as data are normally not being read from and written to a memory device at the same time, either the OED or the GODT signal, but not both, normally transition high. Thus, the NOR gate 224 is either enabled by the low ODTH0 signal to output a timed clock leading edge read data signal corresponding to the QUPH signal, or the NOR gate 224 is enabled by the low QUPH signal to output a high clock leading edge termination signal corresponding to the ODTH0 signal. Either of these signals is coupled to the P0* output terminal on the rising edge of the CLK signal.

The NOR gate 226 operates in a manner similar to the NOR gate 224 to either output a data signal corresponding to the QUPL signal, which is a read data signal that is valid on the falling edge of the CLK signal subsequent to QED transitioning high, or to output a termination signal corresponding to the ODTL0 signal, which is a termination signal that transitions high on the falling edge of the CLK signal following the GODT signal transitioning high. In either case, the output of the NOR gate 226 is a data or termination signal that is valid on the falling edge of the CLK signal, and it is coupled through the pass gate 230 responsive to the falling edge of the CLK signal.

The pull-up logic 94 in the data terminal drive logic 92 also includes a second set of NOR gate 240, 242 and a third set of NOR gates 246, 248, which operate similarly to the NOR gates 224, 226. The NOR gate 240, like the NOR gate 224, outputs a clock rising edge read data signal corresponding to the QUPH signal on the rising edge of the CLK signal following the OED signal transitioning high. The NOR gate 240 also outputs a clock rising edge termination signal. However, unlike the NOR gate 224, which outputs the termination signal responsive to the ODTH0 signal on the rising edge of the CLK signal following the GODT signal transitioning high, the NOR gate 240 outputs the termination signal in such circumstances only in the VDD mode. The signal at the output of the NOR gate 240, which is valid only on the rising edge of the CLK signal, is coupled through a pass gate 250, which is enabled on the rising edge of the pass gate 250. Similarly, the signal at the output of the NOR gate 242, which is valid only on the falling edge of the CLK signal, is coupled through a pass gate 252, which is enabled on the falling edge of the pass gate 252. The outputs from the pass gates 250, 252 are coupled through a pair of inverters 256, 258 to a P1* output terminal.

The third set of NOR gates 246, 248 operate in substantially the same manner as the NOR gates 224, 226 and 240, 242 in the data output mode when read data are being coupled from the memory device. More specifically, the NOR gate 246 outputs a read data signal corresponding to the QUPH signal, which is valid on the rising edge of the CLK signal following the OED signal transitioning high, and the NOR gate 248 outputs a read data signal corresponding to the QUPL signal, which is valid on the falling edge of the CLK signal following the OED signal transitioning high. However, in the termination mode when write data are to be coupled to the data bus terminals, the NOR gates 246, 248 operate in a different manner. In particular, the NOR gates 246, 248 receive the VDDTERMf signal, which is high only in the CTT mode. In the VDD mode, the VDDTERMf signal simply enables the NOR gates 246, 248 so that they function as inverters. The signal at the output of the NOR gate 246, which is valid only on the rising edge of the CLK signal, is coupled through a pass gate 260, which is enabled on the rising edge of the CLK signal. The signal at the output of the NOR gate 248, which is valid only on the falling edge of the CLK signal, is coupled through a pass gate 262, which is enabled on the falling edge of the CLK signal. The outputs from the pass gates 260, 262 are coupled through a pair of inverters 266, 268 to a P2* output terminal.

Figure 8:
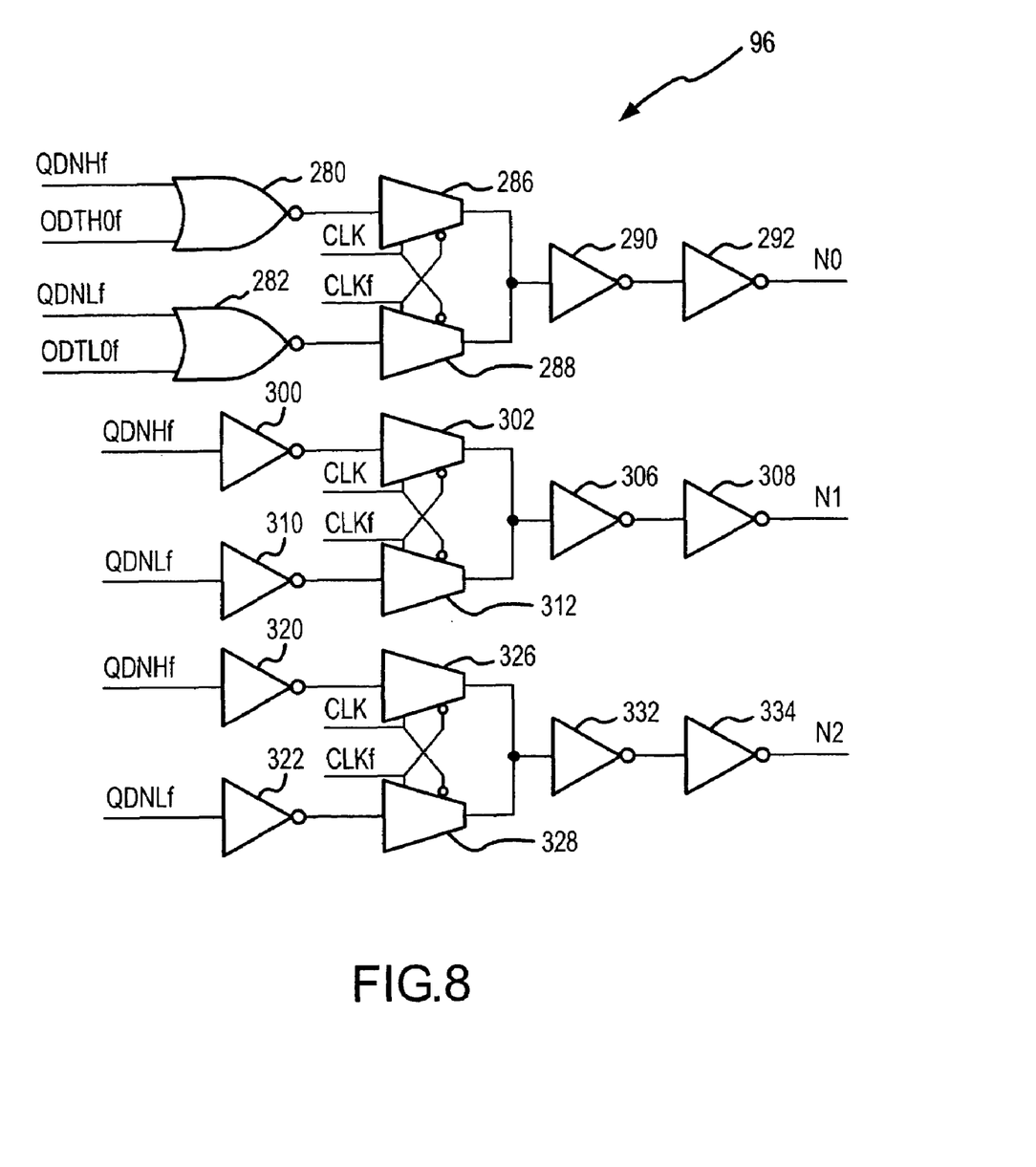
FIG. 8 is a logic diagram showing one embodiment of pull-down logic that may be used in data terminal drive logic, which is part of the data bus terminal mode and impedance control system of FIG. 2.

FIG. 8 shows one embodiment of the pull-down logic 96 used in the data terminal drive logic 92 of FIG. 2. As previously mentioned, the pull-down logic 96 generates signals that selectively drive or bias the data bus terminals 58 low. More specifically, the pull-down logic 96 includes three sets of logic circuits outputting three signals, N0, N1 and N2, which are active high. The first set of logic circuits includes a pair of NAND gates 280, 282 coupled through respective pass-gates 286, 288 to a pair of series connected inverters 290, 292 to produce the N0 signal. The NAND gate 280 receives the QDNHf signal generated by the NAND gate 174, which has a logic level corresponding to the clock rising edge data. The logic level of the QDNHf signal is inactive high to enable the NAND gate 280 when the QE1 signal is low, which occurs either on the falling edge of the CLK signal or when the OED signal has not transitioned high. Thus, the NAND gate 280 is enabled whenever the memory device is not active in outputting clock rising edge read data. The QDNHf signal corresponds to the clock leading edge read data signal responsive to the rising edge of the CLK signal after the OED signal has transitioned high. The signal at the output of the NAND gate 280 is coupled through the pass gate 286 responsive to the leading edge of the CLK signal, and through the inverters 290, 292 to generate the N0 signal. The NAND gate 280 also receives the ODTH0f signal, which is generated at the output of the inverter 130. The ODTH0f signal is low on the rising edge of the CLK signal following the GODT signal transitioning high. Thus, the NAND gate 280 outputs a high on the rising edge of the CLK signal when the data bus terminals are to be terminated for receiving write data signals.

The NAND gate 282 operates in a similar manner to output either a read data signal or a termination signal after the falling edge of the CLK signal. More specifically, the NAND gate 282 receives the QDNLf signal, which is generated by the NAND gate 180. The QDNLf signal corresponds to the clock falling edge read data signal responsive to the falling edge of the CLK signal after the OED signal has transitioned high. This read data signal at the output of the NAND gate 282 is coupled through the pass gate 288 on the falling edge of the CLK signal to generate the N0 signal. When a clock falling edge read data signal is not being output, the QDNLf signal is high to enable the NAND gate 282. The other input of the NAND gate 282 receives the ODTL0f signal, which is generated by the NAND gate 140. The ODTL0f signal is low only in the CTT mode only on the falling edge of the CLK signal after the GODT signal has transition high. At all other times, including at all times in the VDD mode, the ODTL0f signal is high to enable the NAND gate 282. Thus, the NAND gate 282 outputs a high on the falling edge of the CLK signal in the CTT mode when the data bus terminals are to be terminated for receiving write data signals.

The N1 signal is generated from the QDNHf coupled through an inverter 300, a pass gate 302 and a pair of inverters 306, 308 on the rising edge of the CLK signal. The QDNHf signal is also applied to the NAND gate 280, and it corresponds to the clock rising edge read data signal. The N1 signal is also generated from the QDNLf signal, which is coupled through an inverter 310, a pass gate 312 and the inverters 306, 308 on the falling edge of the CLK signal. The QDNLf signal is also applied to the NAND gate 282, and it corresponds to the clock falling edge read data signal. Thus, the N1 signal corresponds to the clock rising edge read data signal responsive to the rising edge of the CLK signal and to the clock falling edge read data signal responsive to the falling edge of the CLK signal. The N1 signal is not generated at any time during the termination period when write data signals are being applied to the memory device or the memory device is inactive.

The N2 signal is generated by inverters 320, 322, pass gates 326, 328 and inverters 332, 334 from the QDNHf and QDNLf signals in the same manner as the N1 signal is generated.

Figure 9:
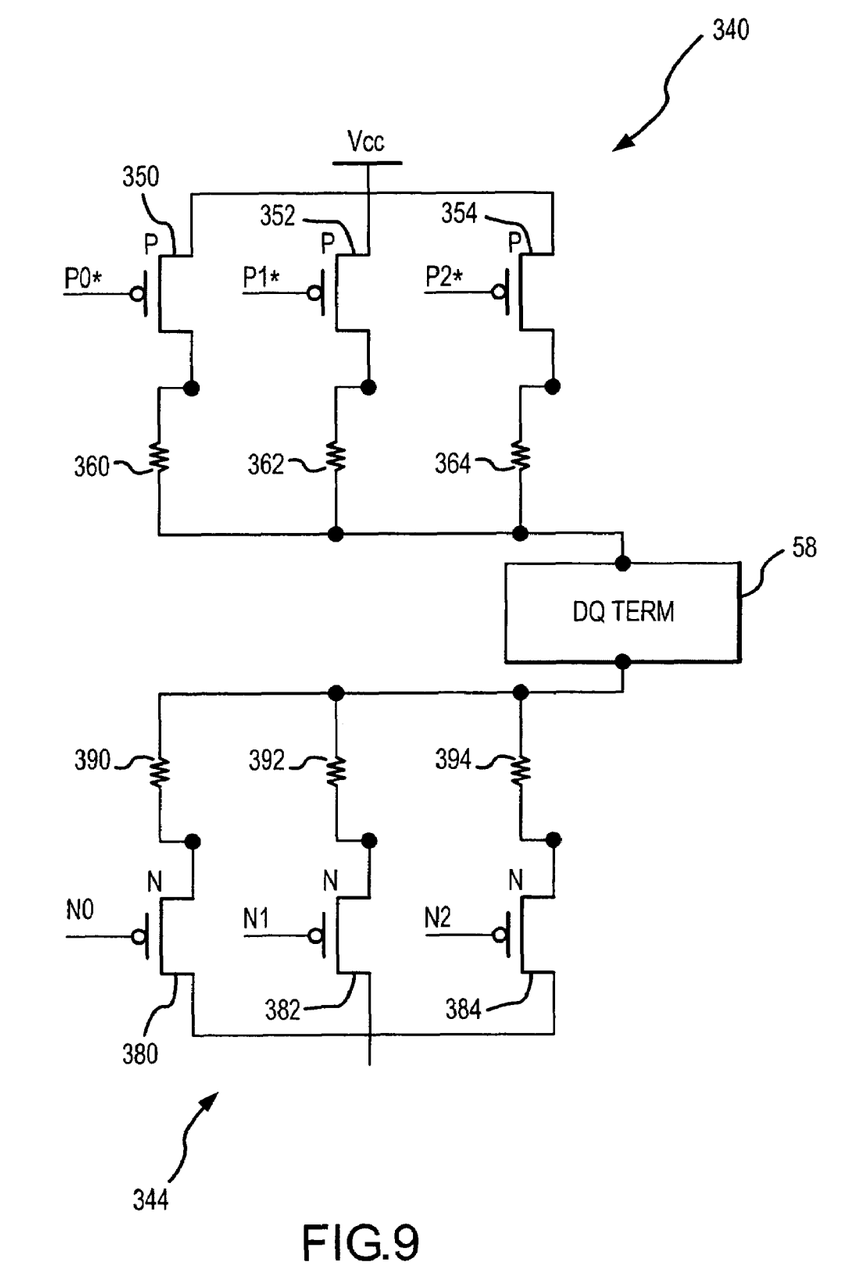
FIG. 9 is a schematic diagram of one embodiment of a pull-up drive circuit and a pull-down drive circuit that may be used in the data bus terminal mode and impedance control system of FIG. 2.

The final component in the data bus terminal mode and impedance control system 80 are a pull-up drive circuit 340 and a pull-down drive circuit 344, embodiments of which are shown in FIG. 9. The pull-up drive circuit 340 includes three PMOS transistors 350, 352, 354 coupled in series with respective resistors 360, 362, 364 between $V_{CC}$ and the data bus terminal 58. The gates of the PMOS transistors 350, 352, 354 receive the P0*, P1* and P2* signals, respectively. When any of the P0*, P1* and P2* signals is active low, the corresponding PMOS transistor 350, 352, 354 is turned ON to drive the data bus terminal 58 to $V_{CC}$. The number of PMOS transistor 350, 352, 354 turned ON controls the output impedance at the data bus terminal 58 when a high read data signal is being output. The number of PMOS transistor 350, 352, 354 turned ON in the VDD mode also controls the termination impedance at the data bus terminal 58 when a write data signal is being applied to the data bus terminal 58.

The pull-down drive circuit 344 includes three NMOS transistors 380, 382, 384 coupled in series with respective resistors 390, 392, 394 between ground and the data bus terminal 58. The gates of the NMOS transistors 380, 382, 384 receive the N0, N1 and N2 signals, respectively. When any of the N0, N1 and N2 signals is active high, the corresponding NMOS transistor 380, 382, 384 is turned ON to drive the data bus terminal 58 to ground. The number of NMOS transistor 380, 382, 384 turned ON controls the output impedance at the data bus terminal 58 when a low read data signal is being output. When one or more of the PMOS transistors 350, 352, 354 is turned ON at the same time one or more of the NMOS transistors 380, 382, 384 is turned ON, the data bus terminal 58 is biased to VCC/2. This situation occurs in the CTT mode when a write data signal is being applied to the data bus terminal 58. The number of PMOS transistors 350, 352, 354 and NMOS transistors 380, 382, 384 that are turned ON in the CTT mode controls the termination impedance at the data bus terminal 58 when a write data signal is being applied to the data bus terminal 58 in the CTT mode.

In operation, when the QED signal transitions high to output read data signals, the PMOS transistors 350, 352, 354 and the NMOS transistors 380, 382, 384 are turned OFF or ON so that the logic level at the data bus terminal 58 corresponds to the read data signal on the rising and falling edges of the CLK signal. In the CTT mode, the PMOS transistors 350, 352, 354 are all turned ON when the read data signal is high. In the VDD mode, only the PMOS transistors 350 and 352 (but not the PMOS transistor 354) are all turned ON when the read data signal is high. It is not necessary to turn the PMOS transistor 354 ON since the data bus terminal 58 is biased high in the VDD mode. When the read data signal is low, all three of the NMOS transistors 380, 382, 384 are turned ON in both the CTT mode and the VDD mode.

When write data signals are to be applied to the data bus terminal 58, the GODT signal transitions high. The PMOS transistors 350, 352, 354 and the NMOS transistors 380, 382, 384 are then selectively turned OFF or ON separately on both the rising and falling edge of the CLK signal to control the bias voltage and impedance at the data bus terminal 58. More specifically, in the VDD mode, the PMOS transistors 350 and 352 are turned ON, and all of the NMOS transistors 380, 382, 384 are turned OFF. In the CTT mode, only the PMOS transistor 350 is turned ON, but the NMOS transistor 380 is also turned ON. By turning only one PMOS transistor 350 and only one NMOS transistor 380 ON, the data bus terminal 58 is biased to VCC/2, but relatively little current is consumed compared to if multiple of the PMOS transistors 350, 352, 354 and NMOS transistors 380, 382, 384 were turned ON.

When neither write data signals are being applied to the SDRAM device 2 and read data signals are not be output from the SDRAM device 2, both the OED and the GODT signals remain low. Therefore, none of the PMOS transistors 350, 352, 354 and none of the NMOS transistors 380, 382, 384 are turned ON.

Figure 10:
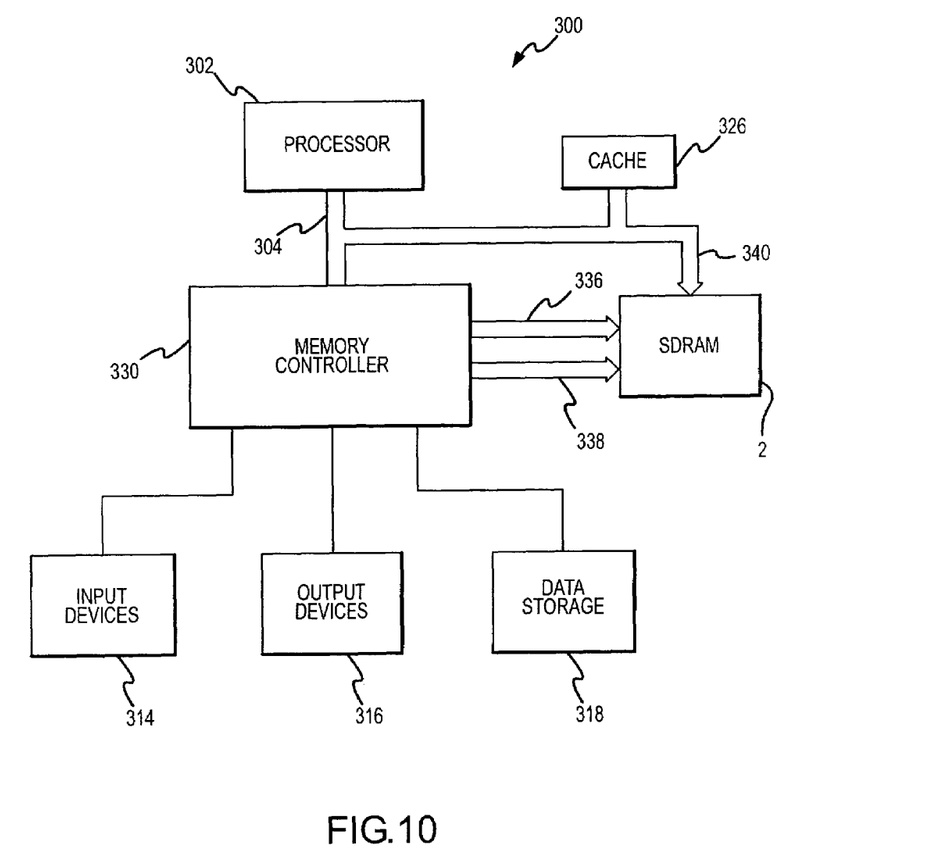
FIG. 10 is a functional block diagram of a computer system that may use the memory device of FIG. 2 or some other embodiment of a memory device using various embodiments of the data bus terminal mode and impedance control system according to the present invention.

The SDRAM device 2 shown in FIG. 1 can be used in various electronic systems. For example, it may be used in a processor-based system, such as a computer system 300 shown in FIG. 10. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data in or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM"), and to the SDRAM device 2 through a memory controller 330. The memory controller 330 normally includes a control bus 336 and an address bus 338 that are coupled to the SDRAM device 2. A data bus 340 is coupled from the SDRAM device 2 to the processor bus 304 either directly (as shown), through the memory controller 330, or by some other means.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

We claim:

1. A system for controlling the operation of a plurality of data bus terminals in a memory device, the system comprising:
a mode register programmable to select either a first mode or a second mode of operation for the data bus terminals, the mode register being operable to output a mode control signal corresponding to the selected mode;
a timing circuit coupled to receive the mode control signal from the mode register, the timing circuit receiving a clock signal and generating timing signals corresponding to the selected one of the first and second modes in synchronism with the clock signal;
a data timing circuit coupled to the timing circuit, the data timing circuit receiving read data signals and generating timed data signals corresponding to the read data signals;
data bus terminal drive logic coupled to the data timing circuit, the data bus terminal drive logic generating output signals responsive to the timed data signals; and
pull-up and pull-down circuitry coupled to the data bus terminal drive logic, the pull-up and pull-down circuitry being operable to drive the data bus terminals to either a first or a second voltage if the first mode of operation is selected and to either a third or a fourth voltage if the second mode of operation is selected.

2. The system of claim 1 wherein the timing circuit is further operable to generate termination timing signals corresponding to the selected one of the first and second modes, and wherein the pull-up and pull-down circuitry is operable to bias the data bus terminals to a fifth voltage if the first mode of operation is selected or to a sixth voltage if the second mode of operation is selected.

3. The system of claim 1 wherein the data timing circuit is operable to generate timed data signals corresponding to the read data signals in synchronism with both a rising edge and a falling edge of the clock signal.

4. The system of claim 1 wherein the timing circuit comprises:
an output enable timing circuit receiving the clock signal, the output enable timing circuit being operable to generate output timing signals synchronized to the clock signal responsive to an output enable signal;

a termination enable timing circuit receiving the clock signal, the termination enable timing circuit being operable to generate termination timing signals synchronized to the clock signal responsive to a termination initiation signal; and a mode timing circuit coupled to the mode register to receive the mode control signal, the mode timing circuit being operable to generate mode timing signals synchronized to the clock signal as a function of the received mode control signal.

5. The system of claim 4 wherein the data timing circuit is coupled to receive the output timing signals from the output enable timing circuit, the data timing circuit coupled to the timing circuit, the data timing circuit being operable to generating the timed data signals corresponding to the read data signals in synchronism with the output timing signals.

6. The system of claim 5 wherein the pull-up circuitry comprises a first set of logic elements each of which has a first input coupled to receive one of the timed data signals from the data timing circuit and a second input coupled to receive one of the termination timing signals from the termination enable timing circuit, and wherein the pull-down circuitry comprises a second set of logic elements each of which has a first input coupled to receive one of the timed data signals from the data timing circuit and a second input coupled to receive one of the termination timing signals from the termination enable timing circuit, the pull-up circuitry being operable to drive the data bus terminals to the first voltage if the first mode of operation is selected and to the third voltage if the second mode of operation is selected, and the pull-down circuitry being operable to drive the data bus terminals to the second voltage if the first mode of operation is selected and to the fourth voltage if the second mode of operation is selected.

7. The system of claim 6 wherein the first voltage is substantially equal to the third voltage, and the second voltage is substantially equal to the fourth voltage.

8. The system of claim 7 wherein the first and third voltage is substantially equal to a supply voltage, and the second and fourth voltage is substantially equal to ground.

9. A memory device, comprising:
a row address circuit operable to receive and decode row address signals applied to external address terminals of the memory device;
a column address circuit operable to receive and decode column address signals applied to the external address terminals;
an array of memory cells operable to store data written to and read from the array at a location determined by the decoded row address signals and the decoded column address signals;
a write data path circuit operable to couple write data signals from the external data bus terminals of the memory device and to couple the write data signals the array;
a command decoder operable to decode a plurality of command signals applied to respective external command terminals of the memory device, the command decoder being operable to generate control signals corresponding to the decoded command signals, the command decoder including a mode register programmable to select either a first mode or a second mode of operation for the data bus terminals, the mode register being operable to output a mode control signal corresponding to the selected mode; and a read data path circuit operable to couple read data signals from the array to the external data bus terminals of the memory device, the read data path comprising:
a timing circuit coupled to receive the mode control signal from the mode register, the timing circuit receiving a clock signal and generating timing signals corresponding to the selected one of the first and second modes in synchronism with the clock signal;
a data timing circuit coupled to the timing circuit, the data timing circuit receiving read data signals and generating timed data signals corresponding to the read data signals;
data bus terminal drive logic coupled to the data timing circuit, the data bus terminal drive logic generating output signals responsive to the timed data signals; and
pull-up and pull-down circuitry coupled to the data bus terminal drive logic, the pull-up and pull-down circuitry being operable to drive the data bus terminals to either a first or a second voltage if the first mode of operation is selected and to either a third or a fourth voltage if the second mode of operation is selected.

10. The memory device of claim 9 wherein the timing circuit is further operable to generate termination timing signals corresponding to the selected one of the first and second modes, and wherein the pull-up and pull-down circuitry is operable to bias the data bus terminals to a fifth voltage if the first mode of operation is selected or to a sixth voltage if the second mode of operation is selected.

11. The memory device of claim 9 wherein the data timing circuit is operable to generate timed data signals corresponding to the read data signals in synchronism with both a rising edge and a falling edge of the clock signal.

12. The memory device of claim 9 wherein the timing circuit comprises:
an output enable timing circuit receiving the clock signal, the output enable timing circuit being operable to generate output timing signals synchronized to the clock signal responsive to an output enable signal;
a termination enable timing circuit receiving the clock signal, the termination enable timing circuit being operable to generate termination timing signals synchronized to the clock signal responsive to a termination initiation signal; and
a mode timing circuit coupled to the mode register to receive the mode control signal, the mode timing circuit being operable to generate mode timing signals synchronized to the clock signal as a function of the received mode control signal.

13. The memory device of claim 12 wherein the data timing circuit is coupled to receive the output timing signals from the output enable timing circuit, the data timing circuit coupled to the timing circuit, the data timing circuit being operable to generating the timed data signals corresponding to the read data signals in synchronism with the output timing signals.

14. The memory device of claim 13 wherein the pull-up circuitry comprises a first set of logic elements each of which has a first input coupled to receive one of the timed data signals from the data timing circuit and a second input coupled to receive one of the termination timing signals from the termination enable timing circuit, and wherein the pull-down circuitry comprises a second set of logic elements each of which has a first input coupled to receive one of the timed data signals from the data timing circuit and a second input coupled to receive one of the termination timing signals from the termination enable timing circuit, the pull-up circuitry being operable to drive the data bus terminals to the first voltage if the first mode of operation is selected and to the third voltage if the second mode of operation is selected, and the pull-down circuitry being operable to drive the data bus terminals to the second voltage if the first mode of operation is selected and to the fourth voltage if the second mode of operation is selected.

15. The memory device of claim 14 wherein the first voltage is substantially equal to the third voltage, and the second voltage is substantially equal to the fourth voltage.

16. The memory device of claim 15 wherein the first and third voltage is substantially equal to a supply voltage, and the second and fourth voltage is substantially equal to ground.

17. The memory device of claim 9 wherein the array of memory cells comprise an array of dynamic random access memory cells.

18. A processor-based system, comprising
a processor having a processor bus;
an input device coupled to the processor through the processor bus adapted to allow data to be entered into the computer system;
an output device coupled to the processor through the processor bus adapted to allow data to be output from the computer system; and
a dynamic random access memory device coupled to the processor bus adapted to allow data to be stored, the dynamic random access memory device comprising:
  a row address circuit operable to receive and decode row address signals applied to external address terminals of the memory device;
  a column address circuit operable to receive and decode column address signals applied to the external address terminals;
  an array of dynamic random access memory cells operable to store data written to and read from the array at a location determined by the decoded row address signals and the decoded column address signals;
  a write data path circuit operable to couple write data signals from the external data bus terminals of the memory device and to couple the write data signals the array;
  a command decoder operable to decode a plurality of command signals applied to respective external command terminals of the memory device, the command decoder being operable to generate control signals corresponding to the decoded command signals, the command decoder including a mode register programmable to select either a first mode or a second mode of operation for the data bus terminals, the mode register being operable to output a mode control signal corresponding to the selected mode; and
  a read data path circuit operable to couple read data signals from the array to the external data bus terminals of the memory device, the read data path comprising:
    a timing circuit coupled to receive the mode control signal from the mode register, the timing circuit receiving a clock signal and generating timing signals corresponding to the selected one of the first and second modes in synchronism with the clock signal;
    a data timing circuit coupled to the timing circuit, the data timing circuit receiving read data signals and generating timed data signals corresponding to the read data signals;
    data bus terminal drive logic coupled to the data timing circuit, the data bus terminal drive logic generating output signals responsive to the timed data signals; and
    pull-up and pull-down circuitry coupled to the data bus terminal drive logic, the pull-up and pull-down circuitry being operable to drive the data bus terminals to either a first or a second voltage if the first mode of operation is selected and to either a third or a fourth voltage if the second mode of operation is selected.

19. The processor-based system of claim 18 wherein the timing circuit is further operable to generate termination timing signals corresponding to the selected one of the first and second modes, and wherein the pull-up and pull-down circuitry is operable to bias the data bus terminals to a fifth voltage if the first mode of operation is selected or to a sixth voltage if the second mode of operation is selected.

20. The processor-based system of claim 18 wherein the data timing circuit is operable to generate timed data signals corresponding to the read data signals in synchronism with both a rising edge and a falling edge of the clock signal.

21. The processor-based system of claim 18 wherein the timing circuit comprises:
  an output enable timing circuit receiving the clock signal, the output enable timing circuit being operable to generate output timing signals synchronized to the clock signal responsive to an output enable signal;
  a termination enable timing circuit receiving the clock signal, the termination enable timing circuit being operable to generate termination timing signals synchronized to the clock signal responsive to a termination initiation signal; and
  a mode timing circuit coupled to the mode register to receive the mode control signal, the mode timing circuit being operable to generate mode timing signals synchronized to the clock signal as a function of the received mode control signal.

22. The processor-based system of claim 21 wherein the data timing circuit is coupled to receive the output timing signals from the output enable timing circuit, the data timing circuit coupled to the timing circuit, the data timing circuit being operable to generating the timed data signals corresponding to the read data signals in synchronism with the output timing signals.

23. The processor-based system of claim 22 wherein the pull-up circuitry comprises a first set of logic elements each of which has a first input coupled to receive one of the timed data signals from the data timing circuit and a second input coupled to receive one of the termination timing signals from the termination enable timing circuit, and wherein the pull-down circuitry comprises a second set of logic elements each of which has a first input coupled to receive one of the timed data signals from the data timing circuit and a second input coupled to receive one of the termination timing signals from the termination enable timing circuit, the pull-up circuitry being operable to drive the data bus terminals to the first voltage if the first mode of operation is selected and to the third voltage if the second mode of operation is selected, and the pull-down circuitry being operable to drive the data bus terminals to the second voltage if the first mode of operation is selected and to the fourth voltage if the second mode of operation is selected.

24. The processor-based system of claim 23 wherein the first voltage is substantially equal to the third voltage, and the second voltage is substantially equal to the fourth voltage.

25. The processor-based system of claim 24 wherein the first and third voltage is substantially equal to a supply voltage, and the second and fourth voltage is substantially equal to ground.

* * * * *